(12) United States Patent
Khandros et al.

(10) Patent No.: US 7,330,039 B2
(45) Date of Patent: Feb. 12, 2008

(54) METHOD FOR MAKING A SOCKET TO PERFORM TESTING ON INTEGRATED CIRCUITS

(75) Inventors: Igor Y. Khandros, Orinda, CA (US); Gaetan L. Mathieu, Livermore, CA (US); Carl V. Reynolds, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/090,614

(22) Filed: Mar. 25, 2005

(65) Prior Publication Data

US 2005/0167816 A1 Aug. 4, 2005

Related U.S. Application Data

(62) Division of application No. 10/310,791, filed on Dec. 6, 2002, now Pat. No. 6,920,689.

(51) Int. Cl.
*G01R 31/02* (2006.01)
(52) U.S. Cl. ........................ 324/755; 324/765; 324/754
(58) Field of Classification Search ........ 324/754–762, 324/765; 439/66–72; 29/860, 825, 840
See application file for complete search history.

(56) References Cited

U.S. PATENT DOCUMENTS

| | | | |
|---|---|---|---|
| 5,772,451 A * | 6/1998 | Dozier et al. ................. | 439/70 |
| 5,806,181 A | 9/1998 | Khandros et al. | |
| 5,917,707 A | 6/1999 | Khandros et al. | |
| 5,974,662 A * | 11/1999 | Eldridge et al. .............. | 29/842 |
| 6,094,060 A * | 7/2000 | Frankeny et al. ........... | 324/760 |
| 6,256,882 B1 | 7/2001 | Gleason et al. | |
| 6,292,003 B1 | 9/2001 | Fredrickson et al. | |
| 6,462,575 B1 * | 10/2002 | Cram ......................... | 324/765 |
| 6,920,689 B2 | 7/2005 | Khandros et al. | |
| 2001/0009376 A1 | 7/2001 | Takekoshi et al. | |
| 2002/0027445 A1 | 3/2002 | Sausen | |

* cited by examiner

*Primary Examiner*—Vinh P. Nguyen
(74) *Attorney, Agent, or Firm*—N. Kenneth Burraston

(57) ABSTRACT

A interconnect structure is inexpensively manufactured and easily insertable into a socket. The interconnect structure is manufactured by forming a sacrificial substrate with cavities that is covered by a masking material having openings corresponding to the cavities. A first plating process is performed by depositing conductive material, followed by coupling wires within the openings and performing another plating process by depositing more conductive material. The interconnect structure is completed by first removing the masking material and sacrificial substrate. Ends of the wires are coupled opposite now-formed contact structures to a board. To complete the socket, a support device is coupled to the board to hold a tested integrated circuit.

8 Claims, 9 Drawing Sheets

METHOD FOR MAKING A SOCKET TO PERFORM TESTING ON INTEGRATED CIRCUITS

CROSS-REFERENCE TO RELATED APPLICATIONS

This application is a divisional of U.S. patent application Ser. No. 10/310,791, filed Dec. 6, 2002, now U.S. Pat. No. 6,920,689.

BACKGROUND OF THE INVENTION

1. Field of the Invention

This invention is directed to a socket for an integrated circuit. More particularly, the socket is a test or burn-in socket for connecting an integrated circuit to a tester for final testing or a burn-in board for burn-in.

2. Background Art

Testing of semiconductor chips is an important operation in semiconductor manufacturing. Different types of tests are performed at different stages of a semiconductor chip manufacturing process. For example, initial tests can be performed on a wafer scale when semiconductor chips have been fabricated on a wafer, but have not yet been diced and packaged. These initial tests may help to identify defective chips prior to performing more expensive and time consuming packaging steps. After the initial testing, a wafer is diced and individual semiconductor chips are packaged. More exacting tests and burn-in operations are then performed on a chip scale to evaluate individual semiconductor chips or groups of multiple chips.

One technique for performing testing and burn-in operation is to cast individual chips in sockets. Unfortunately, limitations exists in conventional sockets. Conventional sockets may be expensive to manufacture and somewhat unreliable. Some conventional sockets have also used pogo pins as contact elements. Such pogo pins are unreliable and non-wiping. Pogo pins also limit the pitch of an interconnect structure in a socket. For example, a pitch of less than 40 mils with pogo pins becomes mechanically difficult and prohibitively expensive.

Therefore, what is needed is a burn-in socket testing device with an easily insertable interconnect structure that is coupled via drop-in, plug-in, or the like connections. The interconnect structure also needs to be manufactured through an inexpensive manufacturing process.

BRIEF SUMMARY OF THE INVENTION

Embodiments of the present invention provide a method including the steps of fabricating elements (e.g., cavities) in a sacrificial substrate, fabricating a contact structure utilizing the elements in the sacrificial substrate, fabricating an interconnect structure utilizing the contact structure, and fabricating a testing board utilizing the interconnect structure. Other embodiments of the present invention provide a burn-in socket manufactured by this method.

Still other embodiments of the present invention provide a system for testing an integrated circuit board. The system includes a socket. The socket includes a board, an interconnect structure manufactured to be insertable into the socket, the interconnect structure being coupled to the board. The interconnect structure includes a substrate and first and second pads coupled to the substrate and coupled to each other through vias running through the substrate, the second pads coupling the interconnect structure to the board. The interconnect structure also includes resilient contacts coupled to the first pads, the resilient contacts interacting with the integrated circuit during the testing. The socket also includes a support structure coupled to the board that secures contact between the integrated circuit board and the resilient contacts during the testing.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate exemplary embodiments of the present invention and, together with the description, further serve to explain the principles of the invention and to enable a person skilled in the pertinent art to make and use the invention.

Figure 1A:
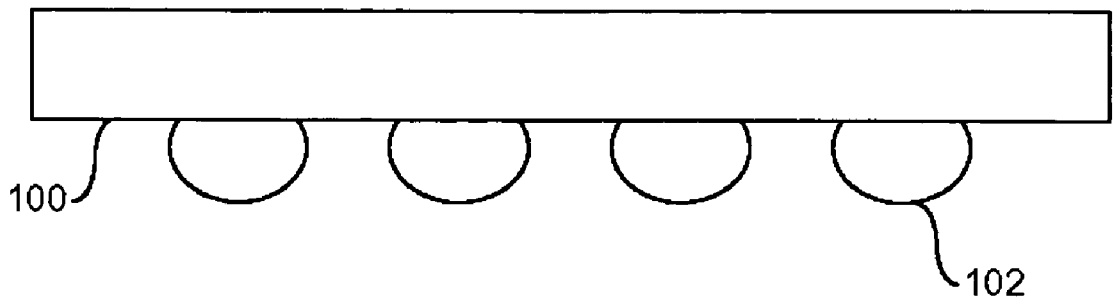
FIGS. 1A and 1B illustrate a side view and a bottom view, respectively, of a tested flip-chip semiconductor according to embodiments of the present invention.

Exemplary embodiments of the present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF EMBODIMENTS THE INVENTION

Embodiments of the invention provide an interconnect structure that is inexpensively manufactured and easily insertable into a socket. The interconnect structure is manufactured by forming a sacrificial substrate with cavities that is covered by a masking material having openings corresponding to the cavities. A first plating process is performed by depositing conductive material, followed by coupling wires within the openings and performing another plating process by depositing more conductive material. The interconnect structure is completed by first removing the masking material and sacrificial substrate. Ends of the wires are coupled opposite now-formed contact structures to a board. To complete the socket, a support device is coupled to the board to hold a tested integrated circuit.

Integrated Circuit Semiconductor

Figure 1B:
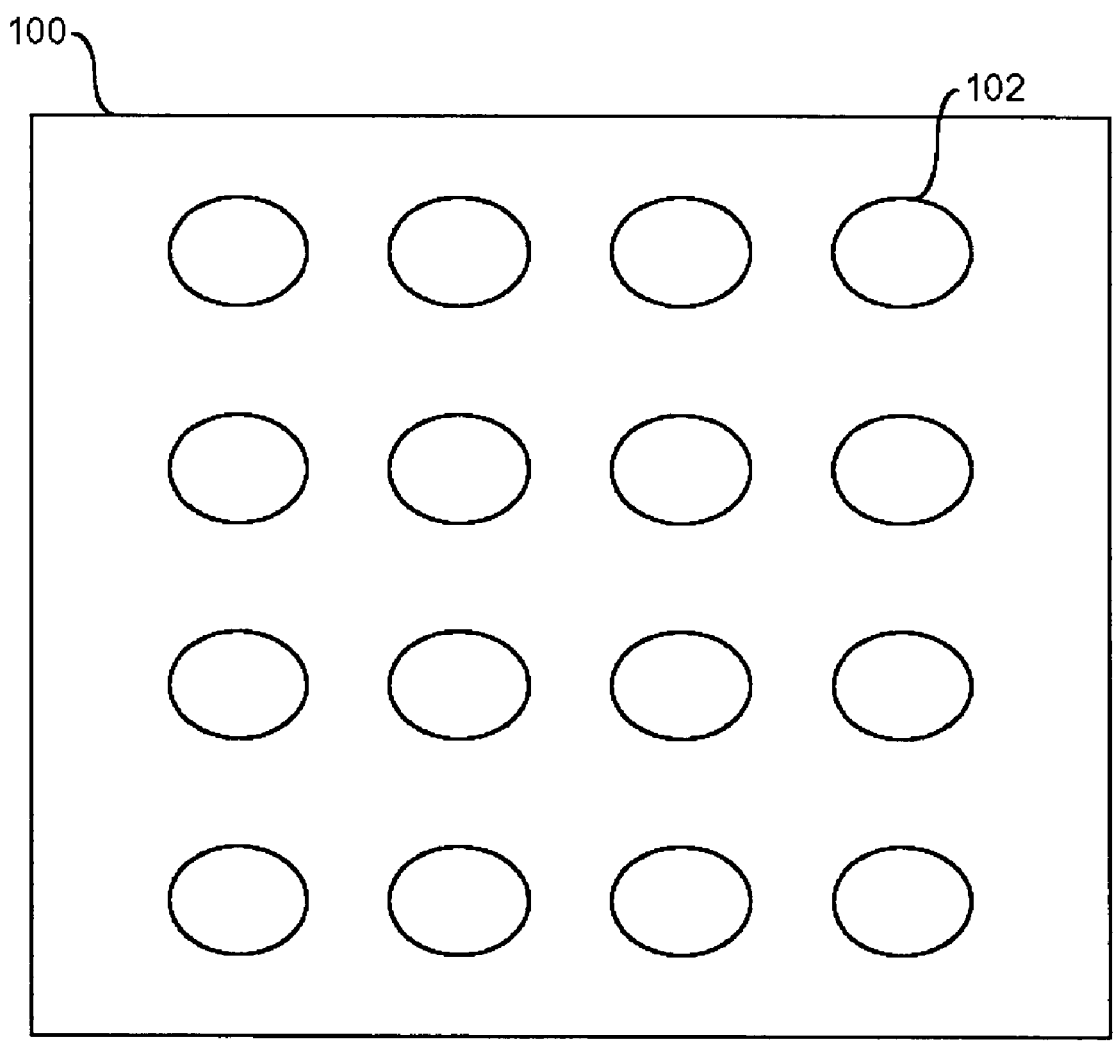

FIGS. 1A-1B show side and bottom views, respectively, of a semiconductor chip 100 (e.g., an integrated circuit (IC)) that is to be tested according to embodiments of the present invention. Semiconductor chip 100 can be packaged or unpackaged. Semiconductor chip 100 can be, but is not limited to, a flip-chip semiconductor with solder ball contacts 102 (e.g., "controlled collapse chip connection" (also known as "C4")). In general, any type of semiconductor chip and contacts can be used.

Interconnect Structure Manufacturing Process

FIGS. 2-6 illustrate a process of making an interconnect structure (e.g., a tile) 514 (FIG. 5) for a socket 600 (FIG. 6) according to embodiments of the present invention.

Figure 2A:
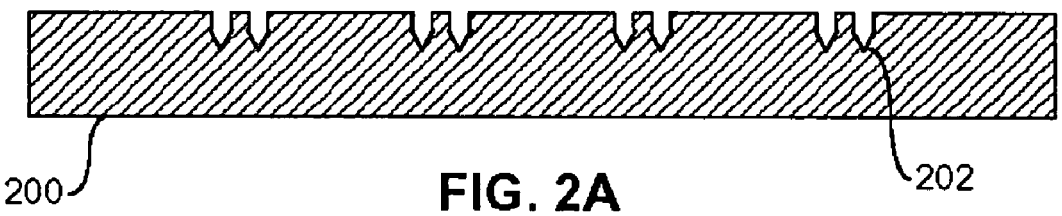
FIGS. 2A and 2B illustrate a cross-sectional and bottom view, respectively, of a sacrificial substrate according to embodiments of the present invention.
Figure 2B:
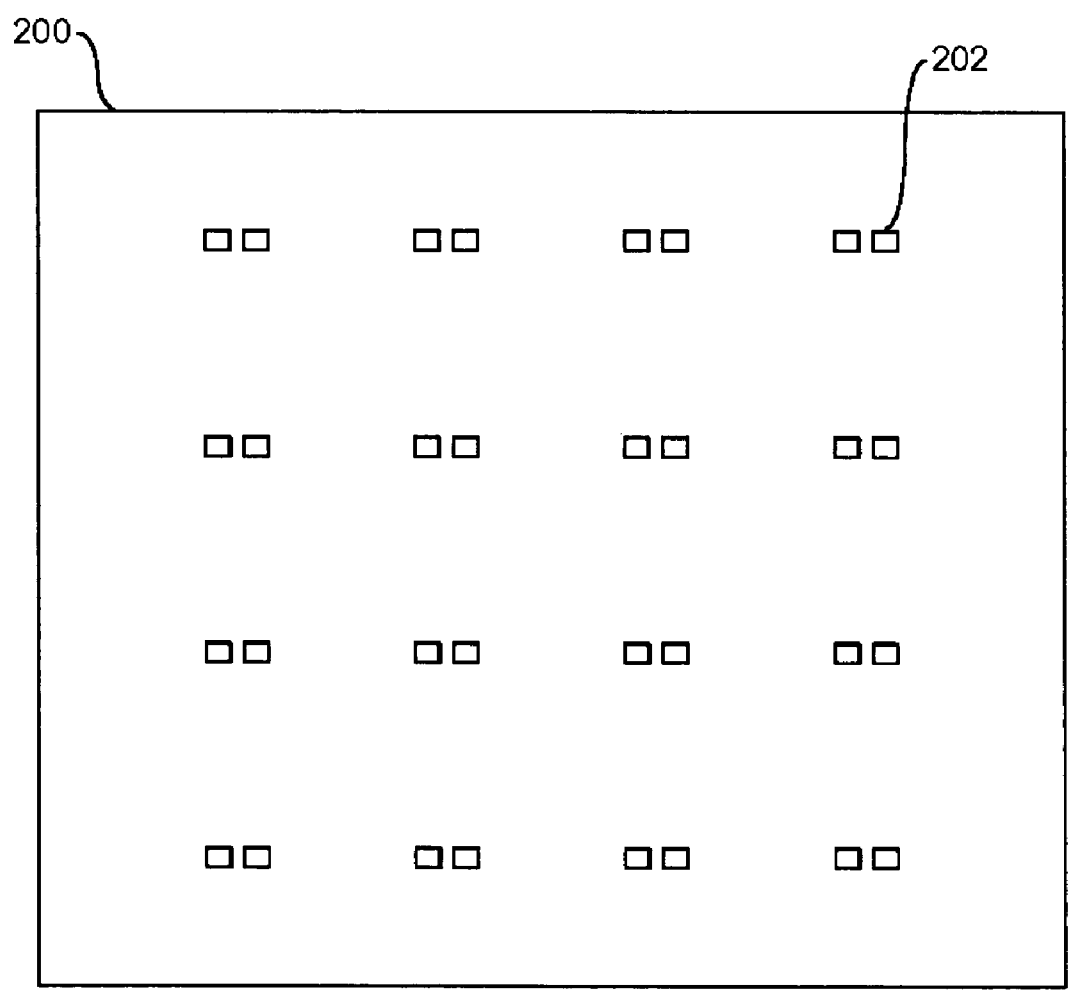

FIGS. 2A-2B show cross-sectional and bottom views, respectively, or a sacrificial substrate 200 according to embodiments of the present invention. Sacrificial substrate 200 can be any material into which elements (e.g., cavities) 202 can be formed. As its name implies, sacrificial substrate 200 can be dissolved, etched away, or otherwise removed from a final structure. In some embodiments, a copper or aluminum sheet or foil can be used for sacrificial substrate 200. In other embodiments, silicon, ceramic, titanium-tungsten, and the like can be used for the sacrificial substrate 200. In various embodiments, cavities 202 can be formed by embossing, etching, or the like. As will be seen, cavities 202 correspond to contacts 102 on semiconductor chip 100.

Figure 3A:
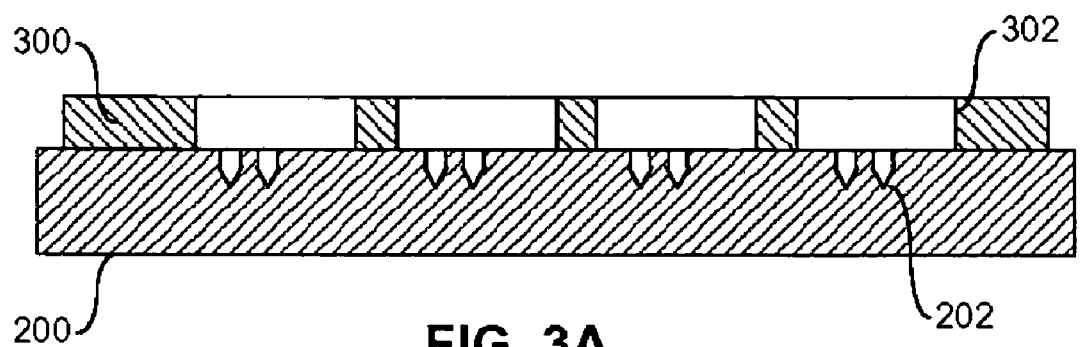
FIGS. 3A and 3B illustrate a cross-sectional and bottom view, respectively, of the sacrificial substrate of FIGS. 2A and 2B with a masking material.
Figure 3B:
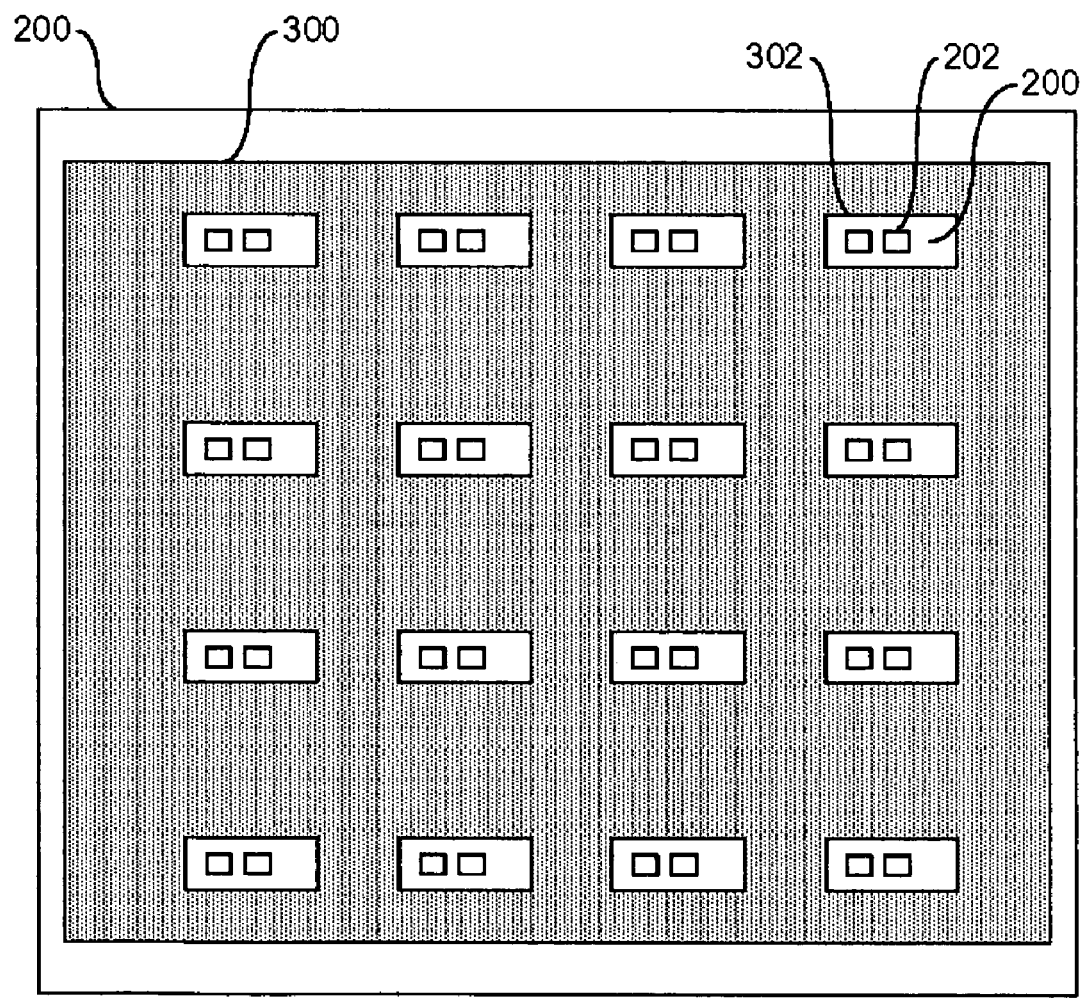

FIGS. 3A-3B show cross-sectional and bottom views, respectively, of sacrificial substrate 200 with a masking material 300 applied, according to embodiments of the present invention. In some embodiments, masking material 300 can be a photoresist material. As shown, openings 302 are formed in masking material 300. These openings 302 expose cavities 202 that were formed in FIG. 2.

Figure 4A:
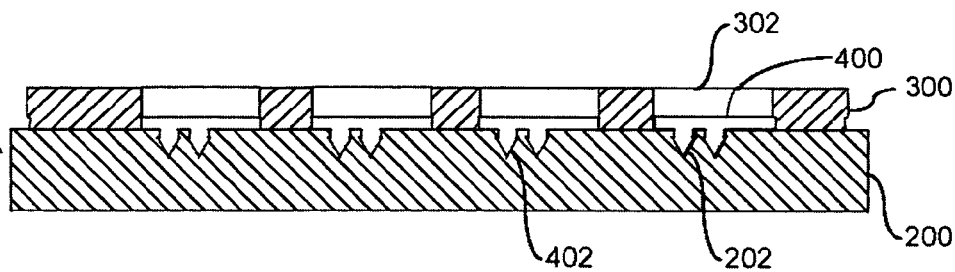
FIGS. 4A, 4B, 4C, and 4D show processing steps for forming a testing socket according to embodiments of the present invention.

FIGS. 4A-4D show additional processing steps according to embodiments of the present invention. In FIG. 4A, a conductive material 400 is deposited or plated in openings 302. In some embodiments, conductive material 400 can be a hard, metallic, and/or electrically conductive material. For example, conductive material 400 can be a rhodium material and a palladium cobalt alloy. As will be seen, conductive material 400 forms a contact tip 402 that is used to contact semiconductor chip 100 during testing. Although shown with two extensions, contact tip 402 can have one or more extensions as required by different specifications and embodiments. In other embodiments, contact tip 402 can be made of a plurality of layered materials, for example a soft gold layer, a nickel layer, and a hard gold layer. In other embodiments an non-exhaustive list of other materials can include: silver, palladium, platinum, rhodium, conductive nitrides, conductive carbides, tungsten, titanium, molybdenum, rhenium, indium, osmium, refractory metals, or the like. Throughout the rest of the specification the term conductive material 400 will be used, and this term is meant to include one or more materials, and if more than one material, layered materials. Conductive material 400 can be deposited in openings 302 using any suitable method. In various embodiments, the deposition method can be electroplating, physical or chemical vapor deposition, sputtering, or the like. The layers that form the contact tip 402 may be deposited in a like manner.

Although not shown, in various embodiments a release material can be deposited in openings 302 before depositing conductive material 400. Use of a release material facilitates eventual removal of a contact structure 506 (FIG. 5B) formed by conductive material 400 from sacrificial substrate 200. In some embodiments, a release layer can be a layer of aluminum. In still other embodiments, although also not shown, a seed layer consisting of a conductive material can also be deposited in openings 302 before depositing conductive material 400. In still other embodiments, the seed layer can be deposited as a blanket layer over the entire sacrificial substrate 200 prior to depositing masking material 300. The seed layer can facilitate electroplating, if electroplating is used to deposit conductive material 400.

Figure 4B:
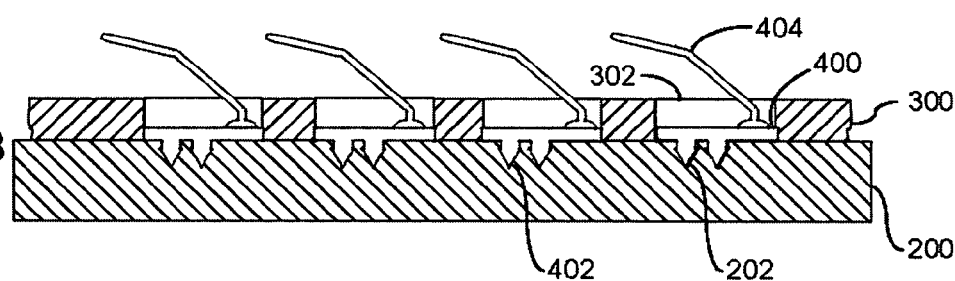

FIG. 4B shows a wire 404 being bonded in each opening 302 to conductive material 400 according to embodiments of the present invention. Wire 404 can be bonded using well known wire bonding techniques. One example of a wire bonding technique is found in U.S. Pat. No. 5,601,740 to Eldridge et al., which is incorporated by reference herein in its entirety. In some embodiments, wire 404 can be made of a relatively soft, readily shapeable material, while in other embodiments other types of materials can be used. Examples of materials that can be used for wire 404 include gold, aluminum, copper, platinum, lead, tin, indium, their alloys, or the like. In some embodiments, the diameter of wire 404 can be in the range 0.25 to 10 mils. It is to be appreciated, wire 404 can have other shaped cross-sections, such as rectangular or any other shape.

Figure 4C:
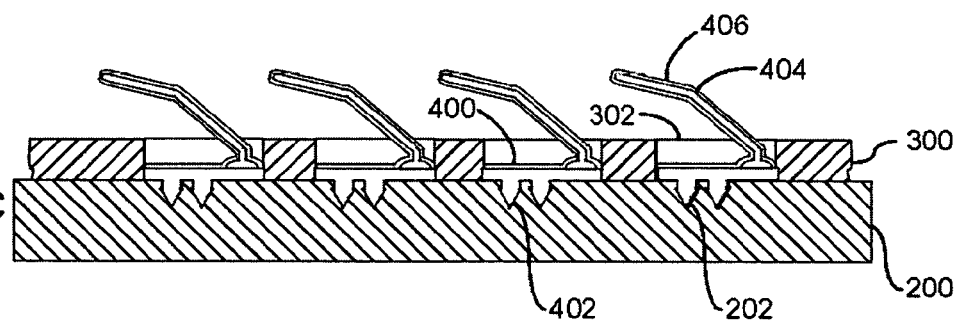

FIG. 4C shows wires 404 and conductive material 400 being plated with a second conductive material 406. In some embodiments, conductive material 406 is harder than a material making up wire 404 to strengthen the contact structure 506 (FIG. 5B). Some examples of suitable materials include, nickel, copper, solder, iron, cobalt, tin, boron, phosphorous, chromium, tungsten, molybdenum, bismuth, indium, cesium, antimony, gold, lead, tin, silver, rhodium, palladium, platinum, ruthenium, their alloys, or the like. In some embodiments, conductive material 406 can be 0.2 to 10 mils thick. Conductive material 406 can be deposited on wire 404 using any suitable method. In various embodiments, deposition methods include electroplating, physical or chemical vapor deposition, sputtering, or the like. Example methods for wire bonding a wire and then over plating the wire are described in U.S. Pat. No. 5,476,211 to Khandros, U.S. Pat. No. 5,917,707 to Khandros et al., and U.S. Pat. No. 6,336,269 to Eldridge et al., which are all incorporated by reference herein in their entirety.

Figure 4D:
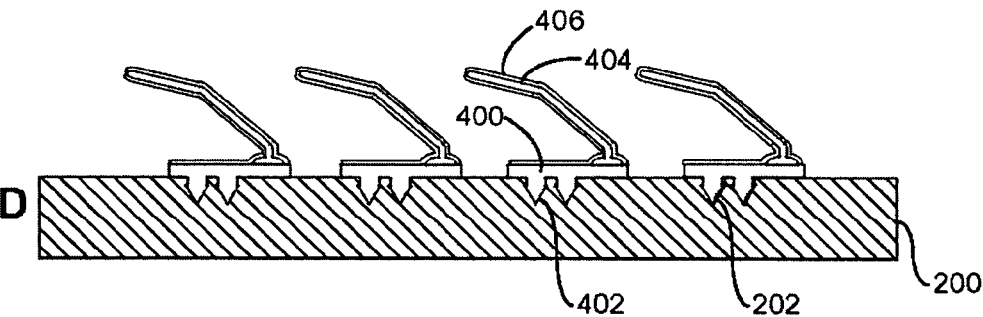

FIG. 4D illustrates the process after masking material 300 has been removed.

Figure 5A:
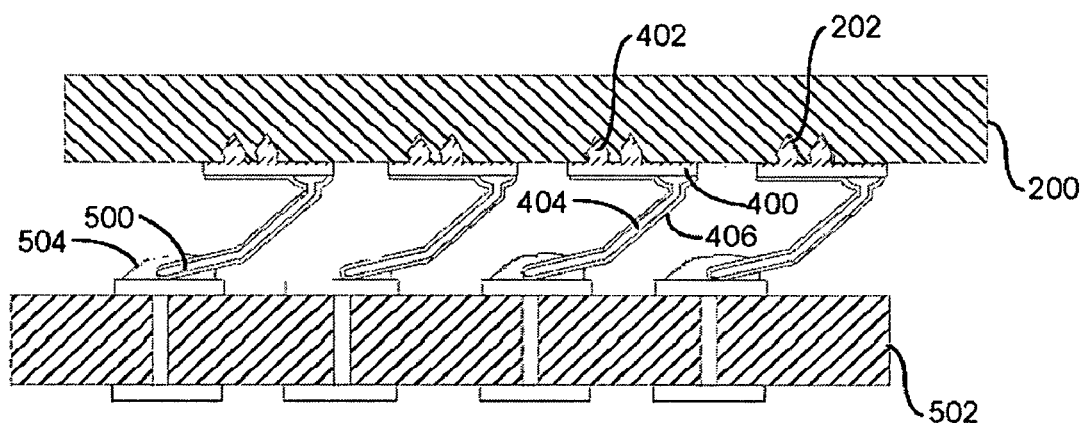
FIGS. 5A and 5B show further processing steps for forming the testing socket according to embodiments of the present invention.
Figure 5B:
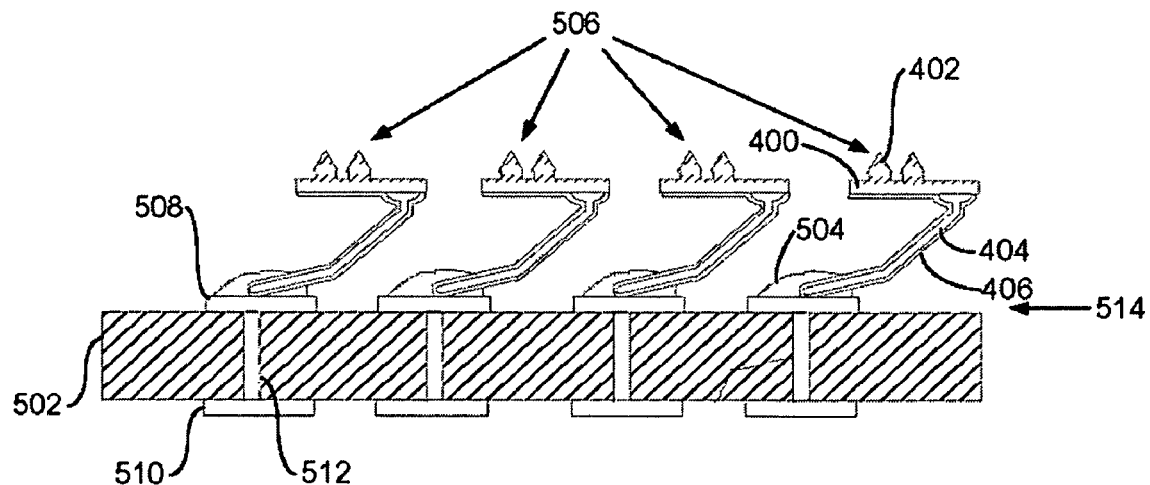

FIGS. 5A-5B show additional processing steps according to embodiments of the present invention. FIG. 5A shows free ends 500 of wires 404 having conductive coating 406 being coupled to a wiring substrate 502 through use of coupling material 504. In various embodiments, the coupling can be done by wiring, soldering, brazing, or the like. In embodiments that the step of coupling free end 500 of wires 404 having conductive coating 406 includes heating, wires 404 and contact structure 506 (FIG. 5B) can also be heat treated. One example of this is found in U.S. Pat. No. 6,150,186 to Chen et al., which is incorporated herein by reference in its entirety, and which discloses methods for heat treating spring contact structures.

Figure 6:
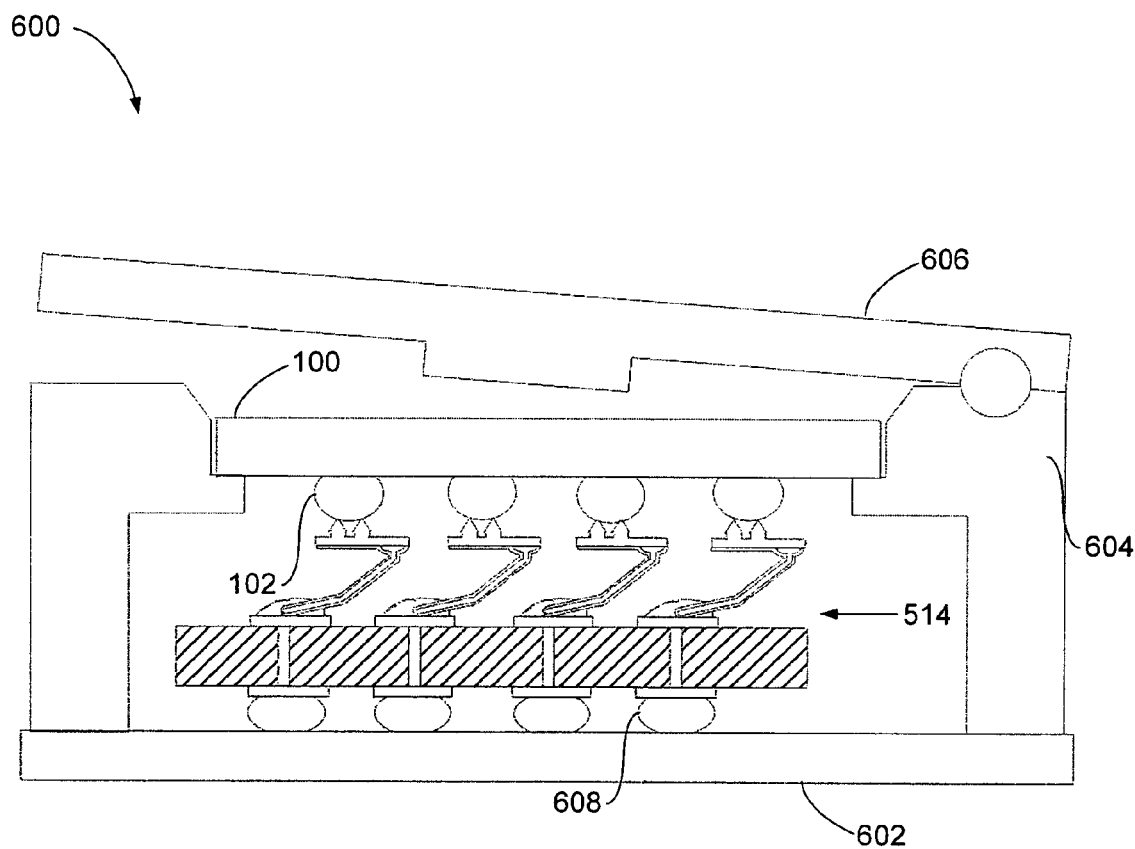
FIG. 6 shows a still further processing step for forming the testing socket according to embodiments of the present invention.

FIG. 5B shows a configuration for wiring substrate 502 according to embodiments of the present invention. Wiring substrate 502 can be a ceramic substrate with pads 508 and 510 on opposite sides of wiring substrate 502. The pads 508 and 510 can be coupled through the use of vias 512 that run through wiring substrate 502. In other embodiments, wiring substrate 502 can be a printed circuit board or a printed wiring board. As also shown in FIG. 5B, sacrificial substrate 200 is removed, which can be done by etching, dissolving, or the like, the material forming sacrificial substrate 200. Another term for the wiring substrate 502 having contact elements 506, the pads 508, 510 and vias 512 is an interconnect structure 514. In some embodiments, interconnect structure 514 can be used to make a test or burn-in socket 600 (FIG. 6). In various embodiments interconnect structure 514 can be a modular interconnect structure, a drop-in interconnect structure, a plug-in interconnect structure, or the like, that is easily inserted into the socket 600, or any other socket.

Further advantages of the process of making interconnect structure 514 according to the present invention are that the process can be inexpensive and can be performed separately on a interconnect structure. In this way, defective interconnect structures can be identified and removed prior to formation of the socket. This process has further advantages in that a interconnect structure with contact elements arranged at a fine pitch of less than 40 mils, including about 10 mils or less, can be made inexpensively and mass produced. Accordingly, this process is a reliable and inexpensive technique for producing a fine pitch socket.

Socket Forming Process

FIG. 6 shows a socket 600 in which interconnect structure 514 is coupled and electrically wired to a board 602 (e.g., a test board or socket board) according to embodiments of the present invention. In some embodiments, board 602 can include a support structure 604 with a hinged closing device 606 for holding integrated circuit (IC) 100 during testing. In various embodiments, board 602 can be a test board or burn-in board. Interconnect structure 514 can electrically connected to board 602 in any suitable manner, such as by soldering 608, pins (not shown), or any other type of contact. For example, the pins can form a friction fit with corresponding holes (not shown). In alternative embodiments, board 602 can be a socket board that is itself plugged into or otherwise attached to a larger test system (not shown).

Figure 7:
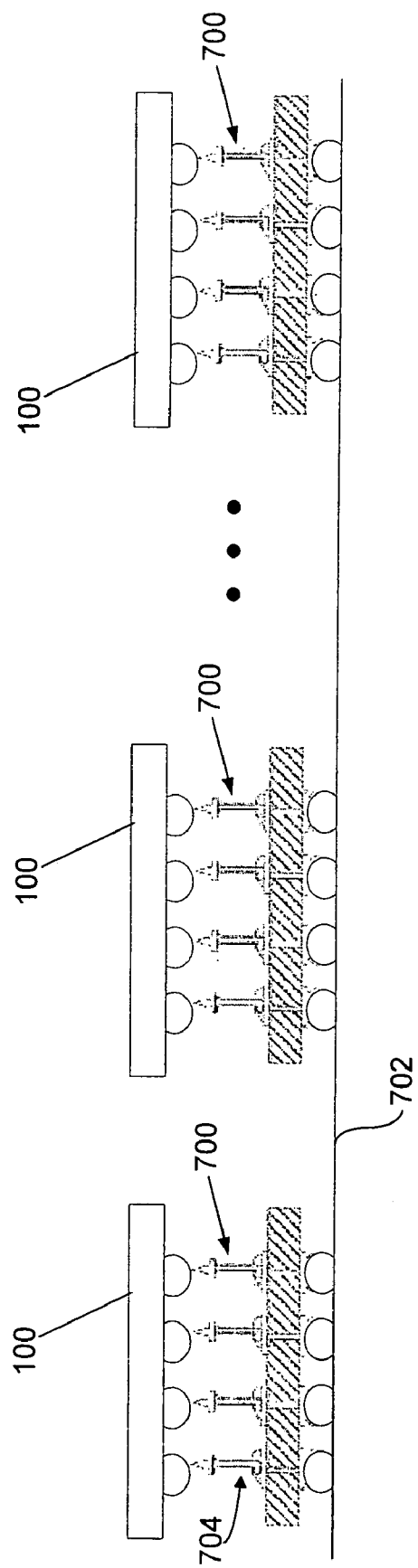
FIG. 7 shows a plurality of sockets used to test a plurality of devices on a wafer according to embodiments of the present invention.

FIG. 7 shows an embodiment with multiple interconnect structures 700 coupled to board 702 according to the present invention. Although shown with multiple IC's 100, in other embodiments one IC 100 with many ball contacts 102 can be tested. In this embodiment, an array of spring contacts 704 for contacting IC 100 is built by coupling a plurality of interconnect structures 700 to board 702 in various configurations depending on the configuration of ball contacts 102. As discussed above, in various embodiments board 702 can be a test board or burn in board, and a plurality of support structures similar to 604 (not shown in FIG. 7 for convenience) can be secured to board 702 around interconnect structures 700.

Methodology to Manufacture the Interconnect Structure and Socket

Figure 8:
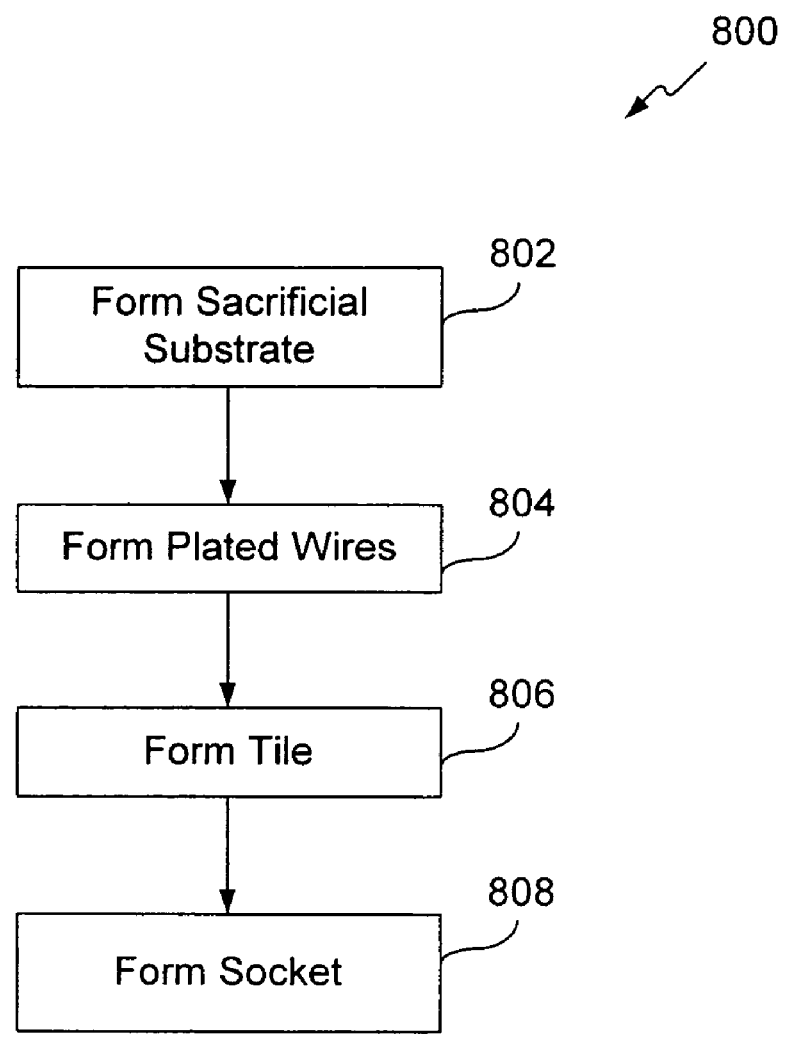
FIG. 8 shows a flowchart depicting an overall method for making a socket according to embodiments of the present invention.

FIG. 8 shows a method 800 for making sockets according to embodiments of the present invention. At step 802, a sacrificial substrate is formed with any type or amount of elements formed in the substrate as desired. For example, cavities can be formed as depicted in FIG. 2. At step 804, plated wires are formed based on the sacrificial substrate. This can be done through the various methods as described with respect to FIGS. 3-4. At step 806, an interconnect structure is formed based on the plated wires. This can be done through the various methods described with respect to FIG. 5. At step 808, a socket is formed based on the interconnect structure. Thus can be done through the various methods described with respect to FIGS. 6 and 7.

Figure 9:
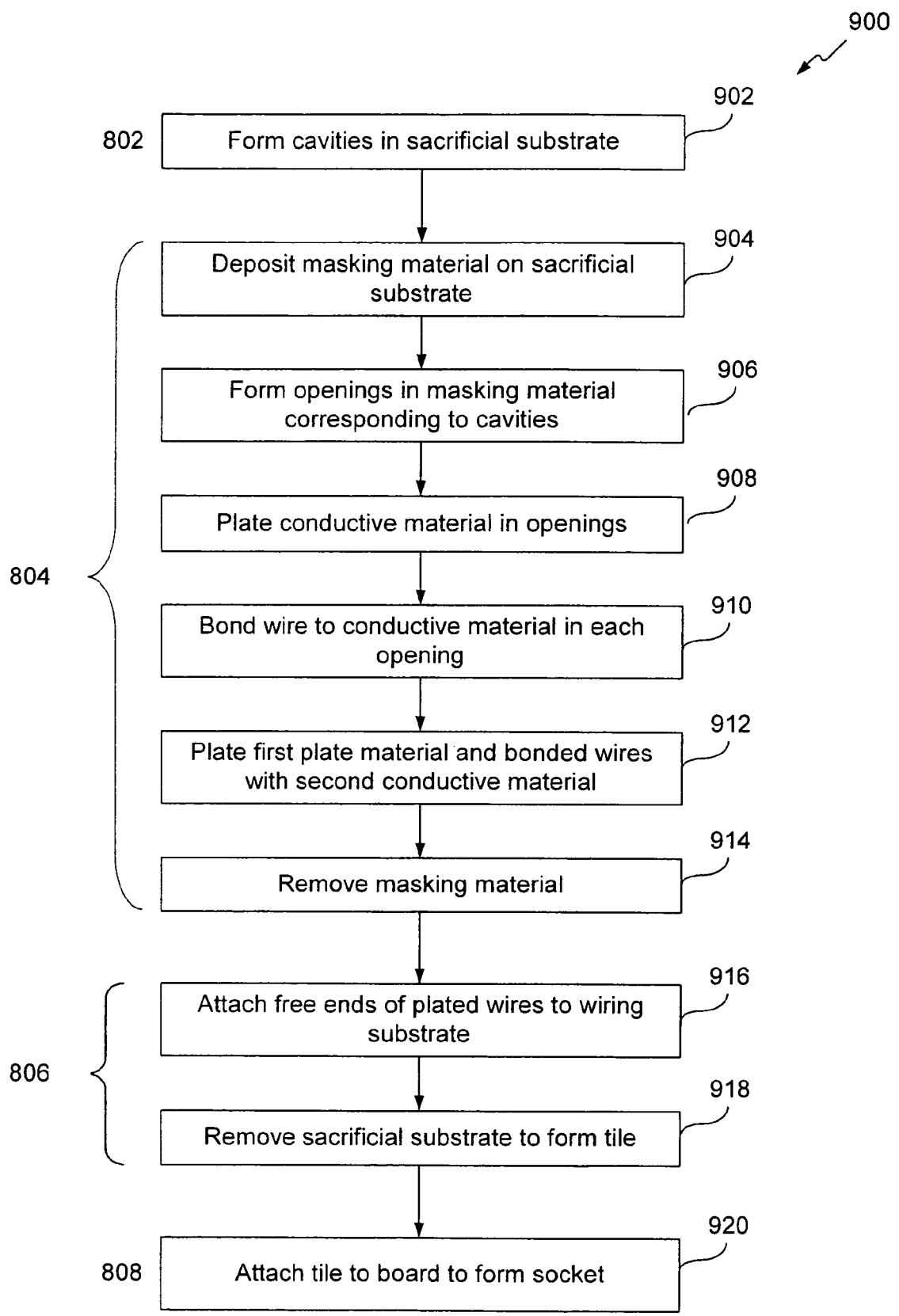
FIG. 9 shows a flowchart depicting more detailed method steps for the method of FIG. 8.

FIG. 9 shows a flowchart depicting a more detailed method 900 for making sockets according to embodiments of the present invention. At step 902, cavities (e.g. elements or cavities 202) are formed in a sacrificial substrate (e.g., substrate 200). At step 904, a masking material (e.g., masking material 300) is deposited on the sacrificial substrate. At step 906, openings (e.g., openings 302) are formed in the masking material corresponding to the cavities. At step 908, conductive material (e.g., conductive material 400) is deposited or plated in the openings. At step 910, wires (e.g., wires 404) are coupled to the conductive material. At step 912, a second conductive material (e.g., conducting material 406) is deposited or plated on the wires and the first conductive material. At step 914, the masking material is removed. At step 916, a coupling material (e.g., coupling material 504) is used to couple tips (e.g., tips 500) of the wires having the conductive material to a wiring substrate (e.g., wiring substrate 502). At step 918, the sacrificial substrate is removed to form an interconnect structure (e.g., interconnect structure 514 or 700). At step 920, the interconnect structure is coupled to a board (e.g., board 602 or 702) to form a socket (e.g., socket 600).

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for exercising an integrated circuit comprising:
   a socket including,
      a board;
      an interconnect structure manufactured to be inserted into said socket, said interconnect structure being coupled to said board, said interconnect structure including,
         a substrate,
         first and second pads coupled to said substrate and coupled to each other through vias running through said substrate, said second pads coupling said interconnect structure to said board, and
         resilient contacts coupled to said first pads, each said resilient contact comprising:
            an elongate, resilient body coupled at a first end to one of said first pads, and
            a plurality of tips extending from a base coupled to a second end of said body, said plurality of tips spaced in sufficient proximity one to another such that each tip contacts a same one of a terminal of said integrated circuit; and
      a support structure that secures contact between the integrated circuit and said resilient contacts during the testing.

2. A system according to claim 1, wherein said interconnect structure is a modular interconnect structure that is inserted into said socket.

3. A system according to claim 1, wherein said interconnect structure is a drop-in interconnect structure that is dropped into said socket.

4. A system according to claim 1, wherein said interconnect structure is a plug-in interconnect structure that is plugged into said socket.

5. A system according to claim 1, wherein said socket includes a plurality of said interconnect structures.

6. A method comprising:
providing resilient spring contact elements on a plurality of substrates, said spring contact elements on each of said substrates disposed in a pattern to correspond to a pattern of terminals on one of a plurality of semiconductor chips, wherein each said spring contact element comprises:
an elongate, resilient body coupled at a first end to one of said substrates;
a plurality of tips extending from a base coupled to a second end of said body, said plurality of tips spaced in sufficient proximity one to another such that each tip contacts a same one of a terminal of one of said chips; and
engaging a plurality of semiconductor chips, each provided in a package after being diced up from a wafer, so that terminals on each one of the chips contact the resilient spring contact elements on one of the substrates, there being a one-to-one correspondence between each of said chips and each of said substrates.

7. The system according to claim 1, wherein each said body comprises a wire that is wire bonded at one end of said wire to one of said bases.

8. The system according to claim 7, wherein each said wire is soldered at another end to one of said first pads.

* * * * *